United States Patent
Ohba et al.

(10) Patent No.: US 6,242,764 B1
(45) Date of Patent: *Jun. 5, 2001

(54) III-N SEMICONDUCTOR LIGHT-EMITTING ELEMENT HAVING STRAIN-MODERATING CRYSTALLINE BUFFER LAYERS

(75) Inventors: Yasuo Ohba; Hiroaki Yoshida, both of Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/116,912
(22) Filed: Jul. 17, 1998

(30) Foreign Application Priority Data

Jul. 17, 1997 (JP) .................................................. 9-192625

(51) Int. Cl.[7] ..................................................... H01N 33/00
(52) U.S. Cl. ........................... 257/190; 257/201; 257/615
(58) Field of Search ................................... 257/190, 201, 257/183, 76, 613, 615

(56) References Cited

U.S. PATENT DOCUMENTS

| | | | |
|---|---|---|---|
| 5,182,670 | * 1/1993 | Khan et al. | 359/359 |
| 5,290,393 | * 3/1994 | Nakamura | 156/613 |
| 5,393,993 | * 2/1995 | Edmond et al. | 257/77 |
| 5,656,832 | * 8/1997 | Ohba et al. | 29/205 |
| 5,874,747 | * 2/1999 | Redwing et al. | 257/77 |
| 5,880,486 | * 3/1999 | Nakamura et al. | 257/96 |
| 5,900,647 | * 5/1999 | Inoguchi | 257/76 |
| 5,903,017 | * 5/1999 | Itaya et al. | 257/190 |
| 5,929,466 | * 7/1999 | Ohba et al. | 257/103 |
| 5,945,689 | * 8/1999 | Koike et al. | 257/88 |
| 5,953,581 | * 9/1999 | Yamasaki et al. | 438/22 |
| 5,959,307 | * 9/1999 | Nakamura et al. | 257/14 |
| 5,970,080 | * 10/1999 | Hata | 372/45 |

FOREIGN PATENT DOCUMENTS 7-249795 * 9/1995 (JP) ..................................... 257/103

OTHER PUBLICATIONS

Bergman et al., Photoluminescence Related to the 2–Dimensional Electron Gas in Modulation Doped GaN/AlGaN Structures, Mat. Res. Soc. Symp. Proc. vol. 395, 1996 Materials Research Society, pp595–600, Dec. 1995.*

I. Akasaki, et al. "Growth of GaN and AlGaN for UV/blue p–n junction diodes" Journal of Crystal Growth 128 (1993, pp. 379–383.

P. Kung, et al. "High quality AlN and GaN epilayers grown on (00.1) sapphire, (100), and (111) silicon substrates" Appl. Phys. Lett. 66 (22), May 29 1995, pp. 2958–2960.

Shuji Nakamura, et al. "InGaN–Based Multi–Quantum–Well–Structure Laser Diodes" Jpn. J. Appl. Phys. vol. 35 (1996), pp. L74–L76, Part 2, No. 1B, Jan. 15, 1996.

* cited by examiner

Primary Examiner—Eddie C. Lee
Assistant Examiner—Bradley W. Baumeister
(74) Attorney, Agent, or Firm—Oblon, Spivak, McClelland, Maier & Neustadt, P.C.

(57) ABSTRACT

Disclosed is a GaN-based compound semiconductor light-emitting element, comprising an AlN buffer layer, a GaN lattice strain moderating layer, and an n-type AlGaN contact layer formed on the layer. The GaN lattice strain moderating layer has a lattice constant larger than that of the AlN buffer layer. On the other hand, the contact layer has a lattice constant smaller than that of the AlN buffer layer. Further, the GaN lattice strain moderating layer has a thickness falling within a range of between 0.01 μm to 0.5 μm.

10 Claims, 3 Drawing Sheets

III-N SEMICONDUCTOR LIGHT-EMITTING ELEMENT HAVING STRAIN-MODERATING CRYSTALLINE BUFFER LAYERS

BACKGROUND OF THE INVENTION

The present inventor relates to a semiconductor light-emitting element using a compound semiconductor material, particularly, to a short wavelength semiconductor light-emitting element using a GaN-based compound semiconductor material.

Gallium nitride (GaN), which is a III–V group compound semiconductor containing nitrogen, exhibits a large band gap of 3.4 eV, is of a direct transition type and, thus, is expected to provide a good material of a short wavelength light-emitting element. However, it is difficult to find a high quality substrate having the lattice matching that of GaN. In many cases, a GaN crystal is grown on a sapphire substrate for the sake of convenience. In this case, since the lattice mismatch between sapphire and GaN is as large as about 15%, the GaN crystal tends to grow in an island shape. Also, if the GaN layer is thickened in an attempt to achieve growth of a high quality GaN layer, serious difficulties are brought about by a difference in thermal expansion coefficient between the sapphire substrate and the grown GaN layer. Specifically, when cooled, dislocation is increased, or the grown GaN layer is cracked. Under the circumstances, it was difficult to grow a high quality GaN film on a sapphire substrate.

In order to alleviate the detrimental effects produced by the lattice mismatch between the sapphire substrate and the grown GaN layer, a very thin buffer layer is formed in general on the sapphire substrate, followed by growing a GaN layer on the buffer layer. The buffer layer is formed by a crystal growth method under low temperatures using an amorphous or polycrystalline AlN or GaN. In this method, the amorphous or polycrystalline layer is considered to alleviate the thermal strain so as to permit the microcrystals contained inside the buffer layer to form collectively a seed crystal having the directions of the original microcrystals aligned in the heating step at a high temperature of 1000° C., leading to an improved crystal quality.

However, a breakthrough dislocation of a high density caused by the lattice mismatch remains to be eliminated in the GaN layer formed on a buffer layer. In the case of growing a GaN-based compound semiconductor layer such as an AlGaN layer or an AlGaInN layer in a thickness of 0.5 $\mu$m or more, said GaN-based compound semiconductor layer having an Al content of at least 15%, which is required for forming a cladding layer of a semiconductor laser, it was unavoidable for the GaN-based compound semiconductor layer to bear cracks caused by residual strain. Where the thickness of the AlGaN layer or AlGaInN layer is 0.2 $\mu$m or less, clear cracking is not recognized. However, fine cracks are recognized when observed with an interatomic force surface microscope. These fine cracks act as. electrical resistance where the substrate is made of an insulating material and where current is conducted in a direction parallel to the compound semiconductor layer, leading to deterioration of life characteristics of the semiconductor element.

Particularly, in the case of using as a substrate SiC having a lattice constant close to that of GaN, the movement of the dislocation is slow because the strain is small at the hetero interface, leading to a large residual strain. Also, since the SiC substrate tends to peel more easily than the sapphire substrate, the SiC substrate itself tends to bear cracks.

As described above, it is known to the art to manufacture a semiconductor light-emitting element emitting light of a short wavelength by growing a GaN-based compound semiconductor layer on a single crystalline substrate such as a sapphire substrate or a SiC substrate. In the conventional technique, however, the lattice mismatch between the substrate and the semiconductor crystal layer causes the grown semiconductor crystal layer to bear residual strain, resulting in failure to grow a high quality crystal. Particularly, it is difficult to form an AlGaN or AlGaInN layer having a high Al content and a small residual strain, leading to deterioration in the characteristics of the semiconductor light-emitting element emitting light of a short wavelength.

BRIEF SUMMARY OF THE INVENTION

An object of the present invention, which has been achieved in view of the situation described above, is to provide a semiconductor light-emitting element including a high quality AlGaN and/or AlGaInN layer formed on a substrate and small in residual strain, the lattice of the substrate failing to match the lattice of the AlGaN and/or AlGaInN layer, leading to an improved element characteristics.

According to an aspect of the present invention, there is provided a semiconductor light-emitting element, comprising:

a first semiconductor layer acting as a buffer layer, having a first lattice constant $LC_1$, and consisting of AlN, AlInN, AlGaInN, AlGaN or SiC;

a second semiconductor layer formed on the first semiconductor layer, acting as a lattice strain moderating layer, having a second lattice constant $LC_2$, and consisting of GaN, GaInN, AlGaN or AlGaInN; and a third semiconductor layer formed on the second semiconductor layer, acting as an element forming region, having a third lattice constant $LC_3$, and consisting of AlGaN or AlGaInN;

wherein the second semiconductor layer has a thickness falling within a range of between 0.01 $\mu$m and 0.5 $\mu$m and the first, second and third lattice constants $LC_1$, $LC_2$ and $LC_3$ meet the relationship $LC_2 > LC_3 > LC_1$.

According to another aspect of the present invention, there is provided a semiconductor light-emitting element, comprising:

a first semiconductor layer acting as a buffer layer, and having a first lattice constant $LC_1$;

a second semiconductor layer formed on the first semiconductor layer, acting as a lattice strain moderating layer, and having a second lattice constant $LC_2$; and a third semiconductor layer formed on the second semiconductor layer, acting as an element forming region, and having a third lattice constant $LC_3$;

wherein the second semiconductor layer has a thickness falling within a range of between 0.01 $\mu$m and 0.5 $\mu$m and the first, second and third lattice constants $LC_1$, $LC_2$ and $LC_3$ meet the relationship $LC_2 > LC_3 > LC_1$.

The first, second and third lattice constants $LC_1$, $LC_2$ and $LC_3$ are lattice constants in a plane parallel to a surface of the semiconductor layer.

It is desirable for the second semiconductor layer to consist of GaN and to have a thickness falling within a range of between 0.05 and 0.15 $\mu$m.

It is also desirable for the second semiconductor layer to be thinner than any of the first and third semiconductor layers.

Further, it is desirable for the second semiconductor layer to consist of AlGaN and for the second lattice constant $LC_2$ to be larger by 0.05 to 0.15% than the third lattice constant $LC_3$.

Further, the single crystalline substrate should desirably consist of sapphire or SiC.

Still further, the third semiconductor layer should desirably have a thickness of 0.2 μm or more and should desirably contain Al in an amount of 10% to 30%.

Additional objects and advantages of the invention will be set forth in the description which follows, and in part will be obvious from the description, or may be learned by practice of the invention. The object and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate a presently preferred embodiment of the invention and together with the general description given above and the detailed description of the preferred embodiment given below, serve to explain the principles of the invention.

DETAILED DESCRIPTION OF THE INVENTION

Figure 1:
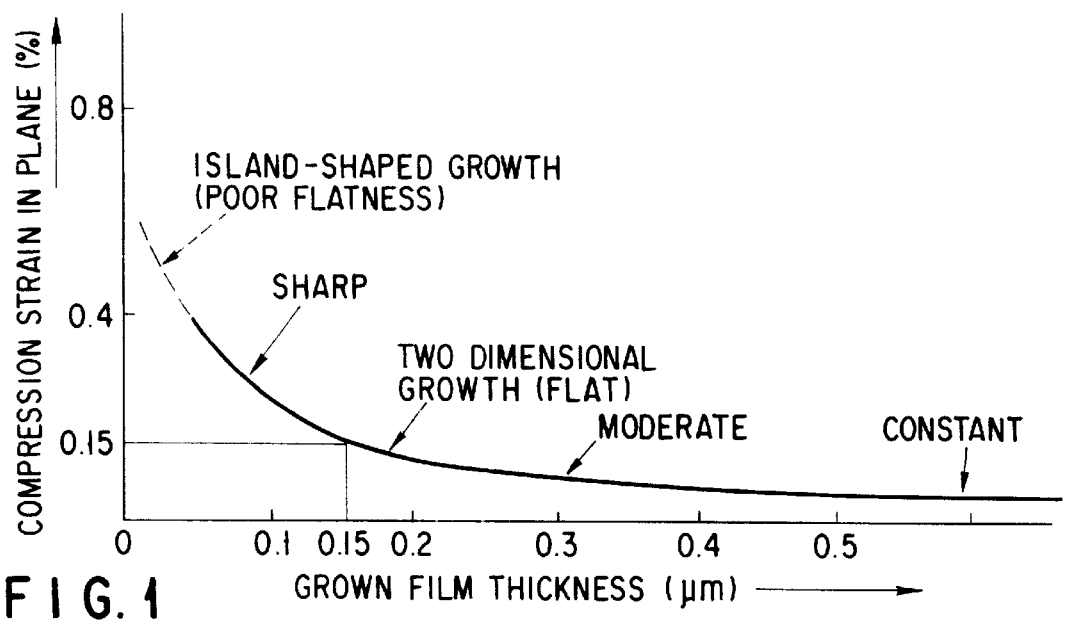
FIG. 1 is a graph showing the relationship between the residual strain of a GaN layer formed on an AlN layer and the grown thickness of the GaN layer.

Cracking is caused by a difference in lattice constant between an AlN or GaN layer grown as a buffer layer on a substrate and an AlGaN layer grown on the buffer layer to form an element structure. When it comes to a GaAlAs series compound semiconductor layer or an InGaAlP series compound semiconductor layer used in the past, dislocation is sufficiently migrated even at about 500° C. lower than a growing temperature. Therefore, a difference in lattice constant did not bring about a serious problem even where the compound semiconductor layer is grown on a heterogeneous substrate such as a silicon substrate. However, migration of the dislocation is slow even at high temperatures exceeding 1000° C. in the case of an AlGaN layer containing 10% or more of Al. Therefore, elimination of strain caused by a difference in lattice constant is considered to be insufficient.

The present inventors have looked into the relationship between a residual strain and a surface flatness, covering the case where an AlGaN series compound semiconductor layer is grown on a heterogeneous substrate. In general, where an AlGaN series compound semiconductor layer is grown on a substrate widely differing in properties from the compound semiconductor layer, an island-shaped growth tends to take place in the initial stage of the growth, giving rise to a rough surface of the grown semiconductor layer, and then the grown semiconductor layer tends to be flattened gradually. It should be noted that a layer grown as a buffer layer is required to have a surface which is likely to be flattened. Each of a GaN layer and an AlN layer, when grown on a heterogeneous substrate, has a flat surface. However, it was difficult to obtain a flat surface in the case of growing an AlGaN layer containing more than 5% of Al on a heterogeneous substrate.

The substrate temperature required for allowing a GaN layer grown thereon to have a flat surface was about 800° C. to 1100° C. This was also the case with an AlGaN layer grown on the substrate. In the case of growing an AlN layer, the substrate temperature required for allowing the grown AlN layer to have a flat surface was higher, i.e., 1150° C. to 1400° C. It has also been found that the grown compound semiconductor layer is required to have a thickness of at least 0.1 μm, preferably 0.2 μm or more, in order to permit the grown semiconductor layer to have a sufficiently flat surface. However, where the thickness of the grown semiconductor layer is 3 μm or more, the grown semiconductor layer has been found to bear cracks caused by accumulation of residual strains.

The present inventors have also looked into the strain moderating effect in the case of growing a GaN, AlN or AlGaN layer on a substantially flat AlN layer.

It has been found that, in the case of growing an AlGaN layer containing more than 10% of Al, the strain moderation is low so as to give rise to crack occurrence in the grown AlGaN layer. In the case of growing an AlN layer, a strain moderating effect was recognized at 1300 to 1400° C., though the effect was not prominent, making it possible to grow a thick AlN layer. In the case of growing a GaN layer, crack occurrence was scarcely recognized in the grown GaN layer. However, where the grown GaN layer was thin, strain was considered to remain remarkably in the grown GaN layer. To be more specific, the lattice constant within a plane of the GaN layer is considered to be intermediate between the lattice constant of an AlN and that of a GaN. It follows that it is possible to form a mixed crystal having an optional lattice constant falling within a range of between the lattice constant of AlN and that of GaN by forming on the AlN layer in an appropriate thickness a compound semiconductor layer which permits moderating the strain such as a GaN layer, a GaInN layer, an AlGaN layer containing 5% or less of Al, or an AlGaInN layer containing 5% or less of Al.

In other words, an AlGaN layer for forming an element structure can be grown on a GaN layer without giving rise to a large lattice mismatch. To be more specific, a buffer layer of, for example, AlN having a lattice constant smaller than that of AlGaN is formed on a single crystalline substrate, followed by forming on the buffer layer a lattice distortion moderating layer of, for example, GaN having a lattice constant larger than that of AlGaN while controlling the thickness of the lattice distortion moderating layer at an optimum value and subsequently forming an AlGaN layer on the GaN layer.

If an AlN layer is grown on a c-plane of a sapphire substrate and, then, a GaN layer is grown on the AlN layer, a compression strain is generated within a plane of the GaN layer. The strain is moderated with growth of the GaN layer. The relationship between the residual strain and the thickness of the grown GaN layer is shown in FIG. 1. In this experiment, the thickness of the AlN layer was set at 0.5 μm, and the GaN layer was grown at 1100° C.

As shown in FIG. 1, the GaN layer grows in an island shape where the thickness of the GaN layer is thinner than 0.05 μm, leading to a poor flatness of the surface. The compression strain lowers rapidly where the thickness of the GaN layer falls within a range of between 0.05 μm and 0.15 μm and, then, further lowers slowly where the thickness of the GaN layer increases to exceed 0.15 μm and reaches 0.5 μm. Finally, the compression strain reaches a constant level where the GaN layer grows to have a thickness larger than 0.5 μm. It follows that, in order to control the strain remaining inside the GaN layer, it is necessary for the GaN layer to have a thickness falling within a range of between 0.05 μm and 0.5 μm, preferably between 0.15 μm and 0.5 μm. If the GaN layer is thinner than 0.05 μm, the GaN layer is rendered unstable to have a rough surface, leading to deterioration of the element characteristics. If the thickness of the GaN layer exceeds 0.5 μm, however, the residual strain required for the lattice matching with a GaAlN layer fails to fall within a desirable range.

An AlGaN layer formed on an AlN layer also exhibits the relationship between the residual strain and the thickness as shown in FIG. 1. As apparent from FIG. 1, inclination of the graph is moderate where the strain falls within a range of between 0.05 and 0.15%, leading to an easier control within this range. Also, since the residual strain is small, the compound semiconductor layer is advantageous in quality of the crystal. It follows that it is desirable to control the composition of the lattice strain moderating layer to permit the lattice constant $LC_2$ of the lattice strain moderating layer to be larger by 0.05 to 0.15% than the lattice constant $LC_3$ of the element forming layer made of, for example, an AlGaN layer. Also, it is desirable for the thickness of the lattice strain moderating layer to fall within a range of between 0.1 and 0.5 μm. It should be noted in this connection that the strain moderating rate of an AlGaN layer differs depending on the element, making it difficult to perform control appropriately. However, the difficulty can be avoided where the thickness of the lattice strain moderating layer falls within a range of between 0.1 and 0.5 μm within which the residual strain is rendered constant.

The semiconductor light-emitting element of the present invention comprises a single crystalline substrate such as a sapphire substrate or a SiC substrate, a buffer layer formed on the substrate and a lattice strain moderating layer formed on the buffer layer. The buffer layer consists of AlN, AlInN, AlGaN, AlGaInN or SiC. The lattice strain moderating layer consists of GaN, GaInN, AlGaN or AlGaInN. Further, an AlGaN or AlGaInN layer having a lattice constant intermediate between those of GaN and AlN is formed on the lattice strain moderating layer. Particularly, the thickness of the lattice strain moderating layer is controlled to fall within a range of between 0.01 μm and 0.5 μm in accordance with the lattice constant of the AlGaN or AlGaInN layer. Because of the moderating effect produced within the lattice strain moderating layer during the crystal growth, the lattice constant within a plane in the vicinity of the surface of the lattice strain moderating layer can be set at a value intermediate between the lattice constants of GaN and AlN layers. It follows that it is possible to control the strain of the AlGaN or AlGaInN layer formed on the lattice strain moderating layer.

A high quality crystal layer of GaN or AlGaN is expected to grow on a SiC substrate. However, the SiC substrate bears cracks caused by lattice mismatch, making it impossible in the past to use a SiC substrate for manufacturing a semiconductor light-emitting element. Therefore, the above-noted prominent effect produced by the present invention is particularly effective in the case where the substrate is formed of SiC.

Let us describe the present invention more in detail with reference to the embodiments shown in the accompanying drawings.

First Embodiment

Figure 2:
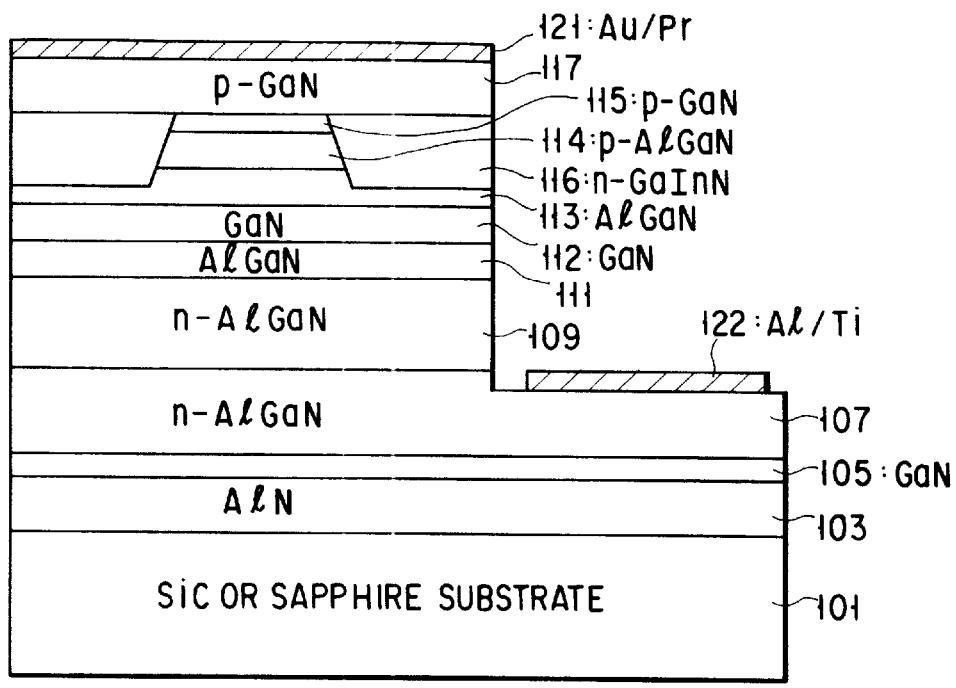
FIG. 2 is a cross sectional view showing the construction of a blue laser diode according to a first embodiment of the present invention.

FIG. 2 is a cross sectional view showing the construction of a blue laser diode according to a first embodiment of the present invention. As shown in the drawing, the laser diode comprises a SiC substrate 101. Formed on a C-plane of the SiC substrate 101 is a laminate structure consisting of an undoped AlN single crystalline buffer layer 103 having a thickness of 5 μm, a GaN lattice strain moderating layer 105 having a thickness of 0.2 μm, an n-type $Al_{0.2}Ga_{0.8}N$ contact layer 107 having a thickness of 1 μm and doped with Si, Se or S at a dose of $2\times10^{18}$ cm$^{-3}$ to $3\times10^{19}$ cm$^{-3}$, an n-type $Al_{0.2}Ga_{0.8}N$ cladding layer 109 having a thickness of 0.5 μm and doped with Si, Se or S at a dose of $5\times10^{17}$ cm$^{-3}$ to $3\times10^{18}$ cm$^{-3}$, a first optical guide layer 111 formed of $Al_{0.1}Ga_{0.9}N$ and having a thickness of 0.1 μm, a GaN active layer 112 having a thickness of 5 nm, a second optical guide layer 113 formed of $Al_{0.9}Ga_{0.9}N$ and having a thickness of 0.1 μm, a p-type $Al_{0.2}Ga_{0.8}N$ cladding layer 114 having a thickness of 0.5 μm and doped with Mg at a dose of $5\times10^{18}$ cm$^{-3}$ to $1\times10^{20}$ cm$^{-3}$, and a p-type GaN intermediate contact layer 115 having a thickness of 0.07 μm and doped with Mg at a dose of $5\times10^{18}$ cm$^{-3}$ to $1\times10^{20}$ cm$^{-3}$. The p-type GaN intermediate contact layer 115 serves to protect the surface in the re-growing step. Also, the composition at the interface between the p-type GaN contact layer 115 and the p-type cladding layer 114 is moderately changed as required so as to lower the electrical resistance.

A striped convex portion having a width of 2 to 5 μm is formed by a reactive ion etching applied to the intermediate contact layer 115, the p-type cladding layer 114 and an upper region of the second optical guide layer 113. Further, a current inhibiting layer 116 consisting of an n-type $Ga_{0.9}In_{0.1}N$ layer doped with Si at a dose of $5\times10^{18}$ cm$^{-3}$ and having a thickness of 0.5 μm is formed by selective growth in a manner to be buried in the free space formed around the striped convex portion. Still further, a p-type GaN contact layer 117 doped with Mg at a dose of $9\times10^{19}$ cm$^{-3}$ and having a thickness of 0.5 μm is formed to cover the upper surfaces of the intermediate contact layer 115 and the current inhibiting layer 116.

Formed on the p-type contact layer 117 is a p-side electrode 121 consisting of a Au/Pr layer. On the other hand, a laminate structure including the uppermost p-type contact layer 117 and the lowermost n-type cladding layer 109 is selectively removed by etching to expose selectively the surface of the n-type contact layer 107, and an Al/Ti film acting as an n-side electrode 122 is formed on the exposed surface of the n-type contact layer 107.

In the embodiment described above, the GaN lattice strain moderating layer 105 having a large lattice constant is formed on the AlN buffer layer 103 having a small lattice constant, with the result that the lattice constant at the surface of the GaN lattice strain moderating layer 105 is made close to that of the n-type AlGaN layer 107 formed thereon. It follows that the n-type AlGaN layer 107 can be formed at a high quality. Also, the various layers positioned on the n-type AlGaN layer 107 can be formed at a high quality. It should also be noted that, in the embodiment shown in FIG. 2, the thickness of the GaN lattice strain moderating layer 105 is set at 0.2 µm, with the result that the residual strain within the GaN layer can be controlled easily, as apparent from the graph of FIG. 1. It follows that it is possible to suppress crack occurrence in each of the layers functioning as a semiconductor element and to decrease the defects so as to improve the element characteristics.

The thickness of each of the compound semiconductor layers included in the blue laser diode shown in FIG. 1 can be changed appropriately. For example, the thickness of the buffer layer 103 can be set at 0.1 to 10.0 µm. The thickness of the lattice strain moderating layer 105 can be set at 0.05 to 0.5 µm. The thickness of the contact layer 107 can be set at 0.5 to 3.0 µm. The thickness of each of the cladding layers 109 and 114 can be set at 0.3 to 0.7 µm. The thickness of each of the optical guide layers 111 and 113 can be set at 0.05 to 0.2 µm. The thickness of the active layer 112 can be set at 1 to 10 nm. Further, the thickness of the intermediate contact layer 115 can be set at 0.05 to 0.1 µm.

In the embodiment described above, the single crystalline substrate 101 is formed of SiC. However, a sapphire substrate can also be used in place of the SiC substrate. Also, any of AlInN, AlGaN, AlGaInN and SiC can be used in place of AlN for forming the buffer layer 103. Further, any of AlGaN, GaInN and AlGaInN can be used in place of GaN for forming the lattice strain moderating layer 105.

In the present invention, it is important for the lattice constant $LC_1$ of a first semiconductor layer acting as a buffer layer, the lattice constant $LC_2$ of a second semiconductor layer acting as a lattice strain moderating layer and the lattice constant $LC_3$ of a third semiconductor layer acting as an element forming region to meet the relationship $LC_2>LC_3>LC_1$. In other words, the lattice constant of the contact layer 107 is required to be intermediate between the small lattice constant of the buffer layer 103 and the large constant of the lattice strain moderating layer 105. For example, where the buffer layer is formed of AlGaN, the Al content of the buffer layer is required to be higher than that of the AlGaN layer constituting the contact layer 107. Likewise, where the lattice strain moderating layer 105 is formed of AlGaN, the Al content of the lattice strain moderating layer 105 is required to be lower than that of the AlGaN layer constituting the contact layer 107.

It is also possible to use GaN in place of AlGaN for forming the optical guide layers 111 and 113. Further, AlGaN or GaInN can be used in place of GaN for forming the active layer 112. Further, Pd/Pt/Au or Ni can be used in place of Au/Pr for forming the p-side electrode 121. Still further, Ti/Pt/Au or Al can be used in place of Al/Ti for forming the n-side electrode 122.

Second Embodiment

Figure 3:
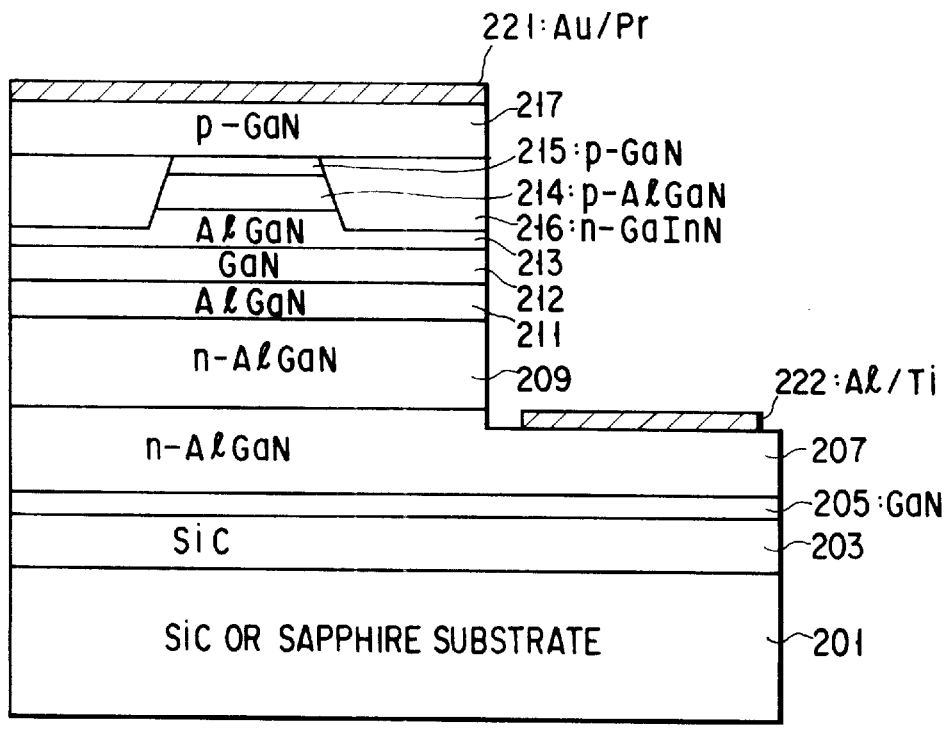
FIG. 3 is a cross sectional view showing the construction of a blue laser diode according to a second embodiment of the present invention.

FIG. 3 is a cross sectional view showing the construction of a blue laser diode according to a second embodiment of the present invention. Reference numerals 201 to 222 put in FIG. 3 correspond to reference numerals 101 to 122 put in FIG. 2, respectively.

The second embodiment shown in FIG. 3 is equal in construction to the first embodiment shown in FIG. 2, except that the buffer layer 203 included in the second embodiment is formed of SiC or AlGaN containing at least 80% of Al. In the second embodiment, the lattice constant of the buffer layer 203 is smaller than that of each of the GaN lattice strain moderating layer 205 and the AlGaN contact layer 207 containing 20% of Al. As in the first embodiment, the lattice strain moderating layer 205 having a large lattice constant is formed on the buffer layer 203 having a small lattice constant in the second embodiment, with the result that the lattice constant on the surface of the lattice strain moderating layer 205 is made close to that of the contact layer 207. It follows that the effect similar to that produced in the first embodiment is also produced in the second embodiment. To be more specific, the lattice constant $LC_1$ of the buffer layer 203, the lattice constant $LC_2$ of the lattice strain moderating layer 205 and the lattice constant $LC_3$ of the contact layer 207 meet the relationship $LC_2>LC_3>LC_1$.

Of course, the second embodiment can also be modified in various fashions as already described in conjunction with the first embodiment.

Third Embodiment

Figure 4:
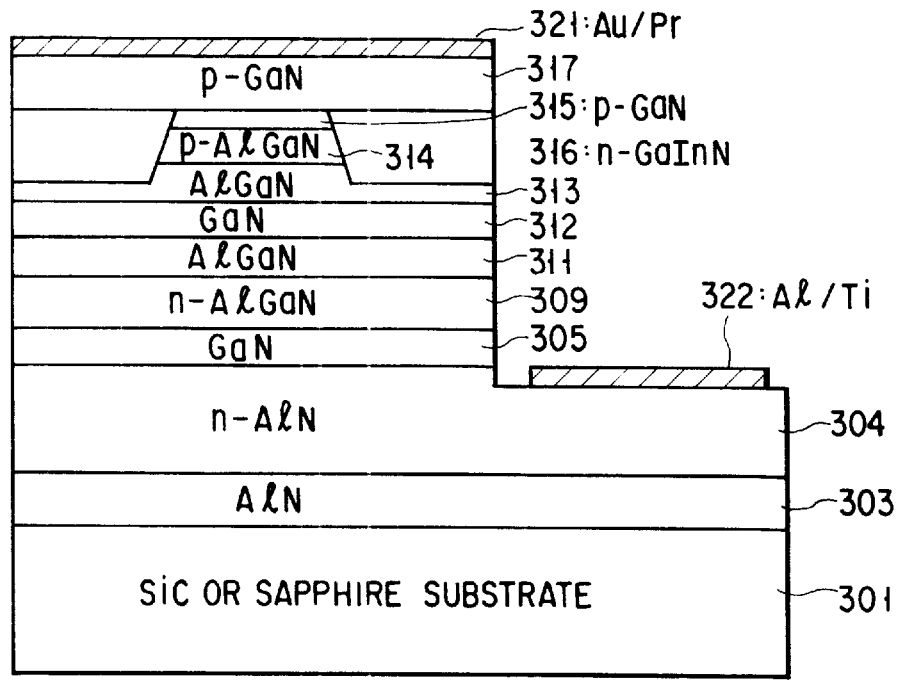
FIG. 4 is a cross sectional view showing the construction of a blue laser diode according to a third embodiment of the present invention.

FIG. 4 is a cross sectional view showing the construction of a blue laser diode according to a third embodiment of the present invention. Reference numerals 301 to 322 put in FIG. 4 correspond to reference numerals 101 to 122 put in FIG. 2, respectively.

The third embodiment shown in FIG. 4 is equal in construction to the first embodiment shown in FIG. 2, except that, in the third embodiment, the electrode on the side of the substrate is formed on an n-type AlN layer or on an AlGaN layer containing at least 80% of Al. To be more specific, in the third embodiment, an n-type AlN contact layer 304 is formed on an AlN buffer layer 303. Also, an n-type lattice strain moderating layer 305 is formed on the n-type AlN contact layer 304. Further, an n-type AlGaN cladding layer 309 is formed on the lattice strain moderating layer 305.

In the third embodiment shown in FIG. 4, each of the AlN buffer layer 303 and the n-type AlN contact layer 304 has a small lattice constant $LC_1$. The GaN lattice strain moderating layer 305 has a large lattice constant $LC_2$. Further, the n-type AlGaN cladding layer 309 has an intermediate lattice constant $LC_3$. It follows that the relationship $LC_2>LC_3>LC_1$ is satisfied in the third embodiment as in the first embodiment. The particular relationship is satisfied even where the contact layer 304 is formed of AlGaN if the Al content of the contact layer is set at 80% or more. It follows that the lattice constant on the surface of the GaN lattice strain moderating layer 305 is made close to that of the AlGaN cladding layer 309, making it possible to improve the crystal quality of the cladding layer 309 and each of the compound semiconductor layers formed on the cladding layer 309.

Of course, the third embodiment can also be modified in various fashions as already described in conjunction with the first embodiment.

Fourth Embodiment

Figure 5:
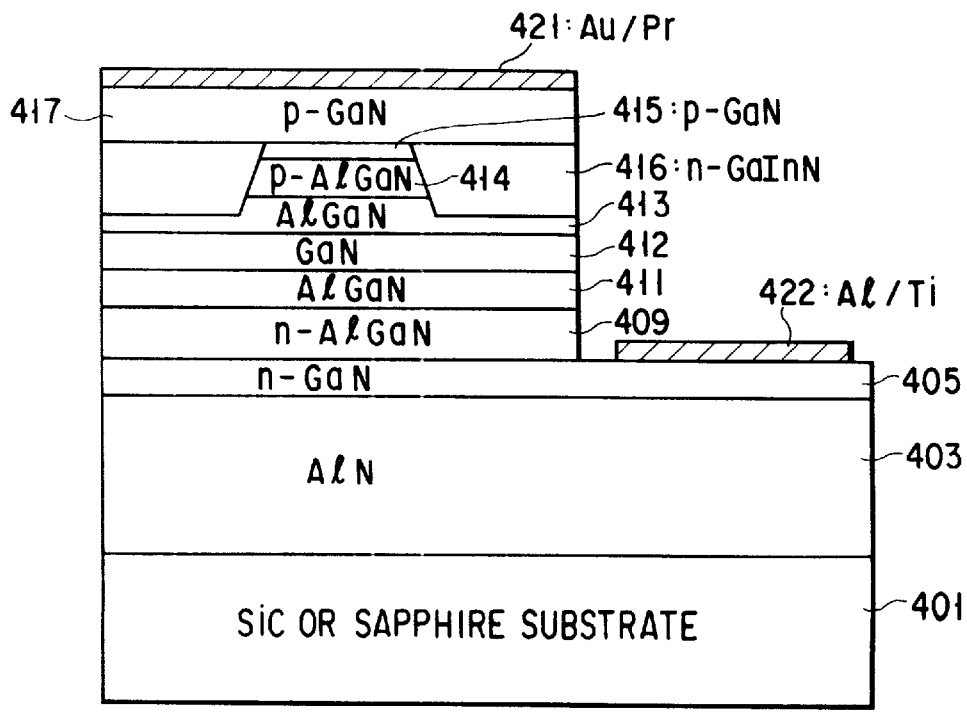
FIG. 5 is a cross sectional view showing the construction of a blue laser diode according to a fourth embodiment of the present invention.

FIG. 5 is a cross sectional view showing the construction of a blue laser diode according to a fourth embodiment of the present invention. Reference numerals 401 to 422 put in FIG. 5 correspond to reference numerals 101 to 122 put in FIG. 2, respectively.

The fourth embodiment shown in FIG. 5 is equal in construction to the first embodiment shown in FIG. 2, except that, in the fourth embodiment, the contact layer on the side of the substrate is omitted, and that the electrode on the side of the substrate is formed on the lattice strain moderating layer. To be more specific, an n-type GaN lattice strain moderating layer 405 is formed on an AlN buffer layer 403. Also, an n-type AlGaN cladding layer 409 is formed on the lattice strain moderating layer 405. Further, an n-side electrode 422 is formed on an exposed surface of the n-type lattice strain moderating layer 405.

In the forth embodiment, the contact layer used in the first embodiment shown in FIG. 2 is omitted. Of course, the lattice constant $LC_1$ of the buffer layer 403, the lattice constant $LC_2$ of the lattice strain moderating layer 405 and the lattice constant $LC_3$ of the cladding layer 409 satisfies the relationship $LC_2 > LC_3 > LC_1$ in the fourth embodiment, too, and, thus, the effect similar to that obtained in the first embodiment can also be obtained in the fourth embodiment.

Further, the fourth embodiment can also be modified in various fashions as already described in conjunction with the first embodiment.

Fifth Embodiment

Figure 6:
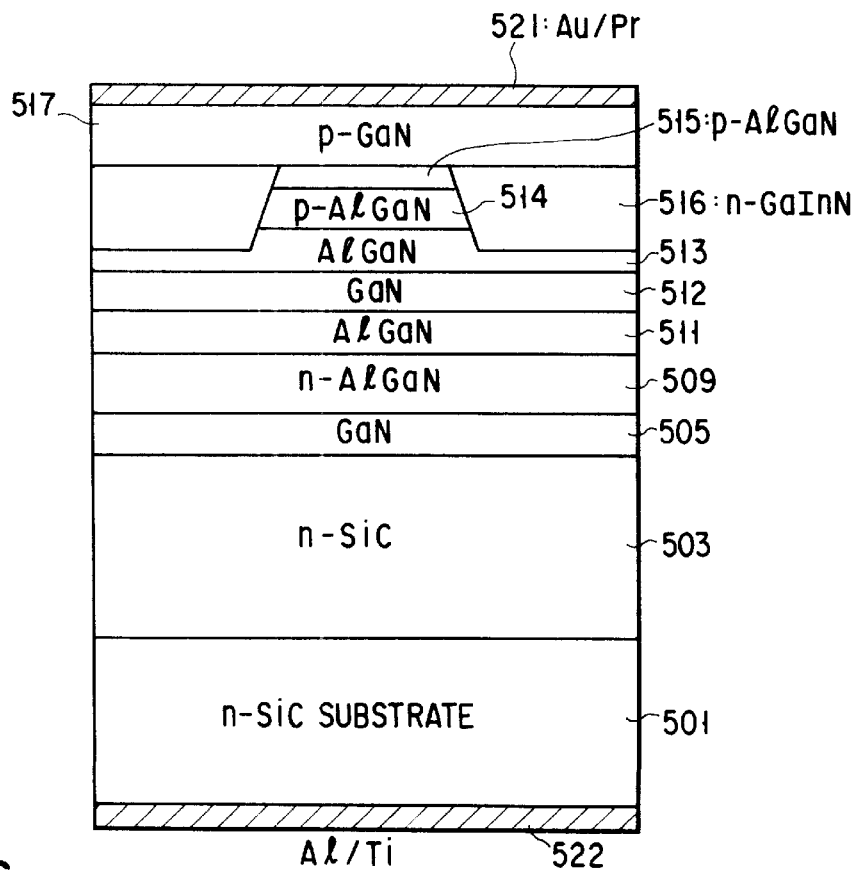
FIG. 6 is a cross sectional view showing the construction of a blue laser diode according to a fifth embodiment of the present invention.

FIG. 6 is a cross sectional view showing the construction of a blue laser diode according to a fifth embodiment of the present invention. Reference numerals 501 to 522 put in FIG. 5 correspond to reference numerals 101 to 122 put in FIG. 2, respectively.

The fifth embodiment is substantially equal in basic construction to the first embodiment shown in FIG. 2, except that, in the fifth embodiment, an electrically conductive material is used for forming the substrate and an electrode is mounted to a back surface of the conductive substrate, with the result that the p-side electrode can be brought into contact with a heat dissipator. To be more specific, each of a SiC substrate 501 and a SiC buffer layer 503 is doped with an n-type impurity and, thus, exhibits an n-type conductivity. Also, an n-side electrode 522 is formed on the back surface of the n-type SiC substrate 501.

Of course, the fifth embodiment of the particular construction also produces an effect similar to that produced in the first embodiment. To be more specific, the lattice constant $LC_1$ of the buffer layer 503, the lattice constant $LC_2$ of the lattice strain moderating layer 505 and the lattice constant $LC_3$ of the cladding layer 509 satisfies the relationship $LC_2 > LC_3 > LC_1$ in the fifth embodiment, too.

Further, the fifth embodiment can also be modified in various fashions as already described in conjunction with the first embodiment.

Sixth Embodiment

The semiconductor light-emitting element according to any of the first to fifth embodiments described above can be manufactured as follows.

Specifically, used in the manufacturing process is a reduced pressure MOCVD apparatus. In the first step, a SiC substrate or a sapphire substrate is put on a susceptor, which also acts as a heater, included in the MOCVD apparatus. Then, a high purity hydrogen gas is introduced through a gas inlet pipe at a rate of 20 L (liters)/min into the reaction tube so as to replace the atmosphere within the reaction tube, followed by connecting a gas exhaust port to a rotary pump so as to reduce the pressure within the reaction tube to 10 to 40 Torr.

Where an AlN single crystal layer is grown on a sapphire substrate, the substrate is heated under a hydrogen gas ($H_2$ gas) atmosphere so as to cleanse the substrate surface. Then, the hydrogen gas is partly replaced by an ammonia gas ($NH_3$ gas), and an organic aluminum compound such as $Al(CH_3)_3$ or $Al(C_2H_5)_3$ is introduced into the reaction tube under the substrate temperature of 1050 to 1300° C. so as to permit a first AlN layer with aligned crystal direction to grow on the substrate surface in a thickness of 5 nm to 500 nm, followed by elevating the substrate temperature to 1350 to 1450° C. so as to permit the AlN layer to grow further by 0.1 $\mu$m to 5 $\mu$m. As a result, the surface of the AlN layer is flattened. In some cases, the AlN growing treatment is suspended and an annealing is performed so as to moderate the residual strain.

In order to align the crystal direction of the first AlN layer, it is important to control the supply ratio (flow rate of $NH_3$/flow rate of organic Al compound) of a V-Group raw material to a III-Group raw material. For forming a high quality AlN film free from pin holes, it is necessary for the supply ratio to fall within a range of between 0.7 and 5.0. Also, for forming a high quality film with a high reproducibility, the raw material supply ratio should desirably fall within a range of between 1.2 and 2.4. In the case of using a SiC substrate, it is not absolutely necessary to form the first AlN layer. However, a layer formed on the AlN layer grows more uniformly.

Where a SiC layer is grown on a substrate, a propane gas as a carbon source and a silane gas ($SiH_4$ gas) as a silicon source are introduced into the reaction tube at supply rates of about 10 cc/min and about 3 cc/min, respectively, so as to form an n-type SiC buffer layer. Then, the substrate temperature is lowered again to 1100 to 1200° C., followed by subsequent treatments to permit the GaN strain moderating layer and a double hetero structure portion to grow on the buffer layer.

The III-Group raw material used in the present invention includes, for example, an organic gallium compound such as $Ga(CH_3)_3$ or $Ga(C_2H_5)_3$ and an organic indium compound such as $In(CH_3)_3$ or $In(C_2H_5)_3$. The raw material of the n-type dopant used in the present invention includes, for example, hydrogenated silane compound such as silane ($SiH_4$) and an organic silicon compound such as $Si(CH_3)_4$. On the other hand, the raw material of the p-type dopant used in the present invention includes an organic Mg compound such as $Cp_2Mg$ or m-$Cp_2Mg$. In order to increase the activation rate of the p-type dopant, it is important to suppress the mixing of hydrogen into or liberation of nitrogen atoms from the crystal during the process of lowering the temperature.

It has been found by the research conducted by the present inventors that a satisfactory result can be obtained by stopping the hydrogen supply and by setting the ammonia partial pressure at 0.2 to 1.0 Torr during the process of lowering the temperature.

The present invention is not limited to the embodiments described above. Of course, the present invention can be modified in various fashions within the technical scope of the present invention.

As described above, high quality AlGaN and AlGaInN layers each having a high Al content can be formed in the present invention even on a substrate whose lattice fails to match with that of the formed layer, making it possible to provide a semiconductor light-emitting element of improved element characteristics.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light-emitting element, comprising:

a single crystalline substrate made of sapphire;

a first single crystalline semiconductor layer directly formed on said single crystalline substrate, having a first lattice constant $LC_1$, and consisting of AlN, AlInN, AlGaInN, AlGaN or SiC;

a second single crystalline semiconductor layer formed on said first semiconductor layer, having a second lattice constant $LC_2$, and consisting of GaN, GaInN, AlGaN or AlGaInN;

a third semiconductor layer formed on said second semiconductor layer, acting as an element forming region, having a third lattice constant $LC_3$, and consisting of AlGaN or AlGaInN; and an electrode directly formed on an exposed surface of said third semiconductor layer;

wherein said first semiconductor layer has a thickness falling within a range of between 0.1 µm and 10 µm and said second semiconductor layer has a thickness falling within a range of between 0.01 µm and 0.5 µm and said first, second and third lattice constants $LC_1$, $LC_2$ and $LC_3$ meet the relationship $LC_2 > LC_3 > LC_1$.

2. The semiconductor light-emitting element according to claim 1, wherein said first, second and third lattice constants $LC_1$, $LC_2$ and $LC_3$ are lattice constants in a plane parallel to a surface of said semiconductor layer.

3. The semiconductor light-emitting element according to claim 1, wherein said second semiconductor layer has a thickness smaller than the thickness of any of the first and third semiconductor layers.

4. The semiconductor light-emitting element according to claim 1, wherein said third semiconductor layer has a thickness of 0.2 µm or more.

5. The semiconductor light-emitting element according to claim 4, wherein said third semiconductor layer contains 10% to 30% of Al.

6. A semiconductor light-emitting element, comprising:

a single crystalline substrate made of sapphire;

a first single crystalline semiconductor layer directly formed on said single crystalline substrate, having a first lattice constant $LC_1$, and consisting of AlN, AlInN, AlGaInN, AlGaN or SiC;

a second single crystalline semiconductor layer formed on said first semiconductor layer, having a second lattice constant $LC_2$, and consisting of GaN; and a third semiconductor layer formed on said second semiconductor layer, acting as an element forming region, having a third lattice constant $LC_3$, and consisting of AlGaN or AlGaInN;

wherein said first semiconductor layer has a thickness falling within a range of between 0.1 µm and 10 µm, said second semiconductor layer has a thickness falling within a range of between 0.05 µm and 0.15 µm and said first, second and third lattice constants $LC_1$, $LC_2$ and $LC_3$ meet the relationship $LC_2 > LC_3 > LC_1$.

7. A semiconductor light-emitting element, comprising:

a single crystalline substrate made of sapphire;

a first semiconductor layer directly formed on said single crystalline substrate, having a first lattice constant $LC_1$, and consisting of AlN, AlInN, AlGaInN, AlGaN or SiC;

a second semiconductor layer formed on said first semiconductor layer, having a second lattice constant $LC_2$, and consisting of AlGaN; and a third semiconductor layer formed on said second semiconductor layer, acting as an element forming region, having a third lattice constant $LC_3$, and consisting of AlGaN or AlGaInN;

wherein said first semiconductor layer has a thickness falling within a range of between 0.1 µm and 10 µm, said second semiconductor layer has a thickness falling within a range of between 0.01 µm and 0.5 µm and said first, second and third lattice constants $LC_1$, $LC_2$ and $LC_3$ meet the relationship $LC_2 > LC_3 > LC_1$.

8. The semiconductor light-emitting element according to claim 7, wherein said second semiconductor layer has a composition which permits the lattice constant $LC_2$ of the second semiconductor layer to be larger by 0.05 to 0.15% than the lattice constant $LC_3$ of the third semiconductor layer.

9. The semiconductor light-emitting element of claim 7, wherein:

said first semiconductor layer comprises a single crystalline semiconductor layer; and said second semiconductor layer comprises a single crystalline semiconductor layer.

10. The semiconductor light-emitting of claim 9, wherein said second semiconductor layer has a composition which permits the lattice constant $LC_2$ of the second semiconductor layer to be larger than by 0.05 to 0.15% than the lattice constant $LC_3$ of the third semiconductor layer.

* * * * *